United States Patent
Mabuchi et al.

(10) Patent No.: US 10,741,593 B1
(45) Date of Patent: Aug. 11, 2020

(54) VERTICAL TRANSFER GATE STORAGE FOR A GLOBAL SHUTTER IN AN IMAGE SENSOR

(71) Applicant: OmniVision Technologies, Inc., Santa Clara, CA (US)

(72) Inventors: Keiji Mabuchi, Los Altos, CA (US); Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/422,646

(22) Filed: May 24, 2019

(51) Int. Cl.
*H01L 27/146* (2006.01)
*H04N 5/359* (2011.01)
*H04N 5/378* (2011.01)

(52) U.S. Cl.
CPC .... *H01L 27/14614* (2013.01); *H01L 27/1463* (2013.01); *H01L 27/14623* (2013.01); *H04N 5/3592* (2013.01); *H04N 5/378* (2013.01)

(58) Field of Classification Search
CPC ........... H01L 27/14643; H01L 27/1463; H01L 27/14623; H04N 5/378; H04N 5/3592
See application file for complete search history.

(56) References Cited

U.S. PATENT DOCUMENTS

| | | | |
|---|---|---|---|
| 5,040,038 A * | 8/1991 | Yutani | H01L 27/14831 257/229 |
| 5,040,071 A * | 8/1991 | Stevens | H01L 27/14831 257/221 |
| 5,410,349 A * | 4/1995 | Tanigawa | H01L 27/14831 257/242 |
| 8,791,512 B2 | 7/2014 | Roy et al. | |
| 9,324,753 B2 | 4/2016 | Kato et al. | |
| 9,843,754 B1 | 12/2017 | Yi | |
| 2001/0024854 A1 * | 9/2001 | Takeuchi | H01L 21/76831 438/253 |
| 2006/0007333 A1 * | 1/2006 | Horii | H01L 27/14656 348/294 |
| 2007/0222036 A1 * | 9/2007 | Park | H01L 27/101 257/619 |
| 2008/0036888 A1 | 2/2008 | Sugawa et al. | |
| 2011/0084322 A1 * | 4/2011 | Kang | H01L 27/1461 257/292 |
| 2011/0089311 A1 * | 4/2011 | Venezia | H01L 27/14603 250/208.1 |

(Continued)

*Primary Examiner* — Chiawei Chen
(74) *Attorney, Agent, or Firm* — Christensen O'Connor; Johnson Kindness PLLC

(57) ABSTRACT

A pixel cell includes a photodiode disposed in a semiconductor material layer to accumulate image charge photogenerated in the photodiode in response to incident light. A storage transistor is coupled to the photodiode to store the image charge photogenerated in the photodiode. The storage transistor includes a storage gate disposed proximate a first surface of the semiconductor material layer. The storage gate includes a pair of vertical transfer gate (VTG) portions. Each one of the pair of VTG portions extends a first distance into the semiconductor material layer through the first surface of the semiconductor material layer. A storage node is disposed below the first surface of the semiconductor material layer and between the pair of VTG portions of the storage gate to store the image charge transferred from the photodiode in response to a storage signal.

31 Claims, 6 Drawing Sheets

(56) References Cited

U.S. PATENT DOCUMENTS

| | | | |
|---|---|---|---|
| 2016/0005785 A1* | 1/2016 | Barbier | H04N 5/3594 |
| | | | 250/208.1 |
| 2016/0049429 A1 | 2/2016 | Lee et al. | |
| 2016/0086984 A1* | 3/2016 | Wang | H01L 27/1463 |
| | | | 257/292 |
| 2016/0343751 A1* | 11/2016 | Sze | H01L 27/1464 |
| 2017/0134683 A1* | 5/2017 | Guyader | H04N 5/353 |
| 2017/0250210 A1 | 8/2017 | Kato et al. | |
| 2018/0166496 A1* | 6/2018 | Stark | H01L 27/14687 |
| 2018/0190697 A1* | 7/2018 | Lee | H01L 27/14609 |

* cited by examiner

VERTICAL TRANSFER GATE STORAGE FOR A GLOBAL SHUTTER IN AN IMAGE SENSOR

BACKGROUND INFORMATION

Field of the Disclosure

The present invention is related generally to image sensors, and more specifically, related to image sensor pixel cells having global shutters.

Background

For high-speed image sensors, a global shutter can be used to capture fast-moving objects. A global shutter typically enables all pixel cells in the image sensor to simultaneously capture the image. For slower moving objects, the more common rolling shutter may be used. A rolling shutter normally captures the image in a sequence. For example, each row within a two-dimensional (2D) pixel cell array may be enabled sequentially, such that each pixel cell within a single row captures the image data at the same time, but each row is enabled in a rolling sequence. As such, each row of pixel cells captures the image data during a different image acquisition window. For slow moving objects, the time differential between each row can generate image distortion. For fast-moving objects, a rolling shutter can cause a perceptible elongation distortion along the object's axis of movement.

To implement a global shutter, storage capacitors or storage transistors can be used to temporarily store the image charge acquired by each pixel cell in the array while it awaits to be read out from the pixel cell array. When a global shutter is used, image charge is transferred from the photodiode to the storage transistor until the image data is ready to be read out from the pixel cell. Factors that affect performance in an image sensor pixel cell having a global shutter include global shutter efficiency, full well capacity (FWC), dark current, white pixels, and image lag. In general, global shutter pixel performance improves as global shutter efficiency improves. Global shutter efficiency is a measure of how well signal charge can be stored in the storage node without being contaminated by parasitic light and/or electrical crosstalk, while FWC is a measure of the amount of charge that can be stored.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
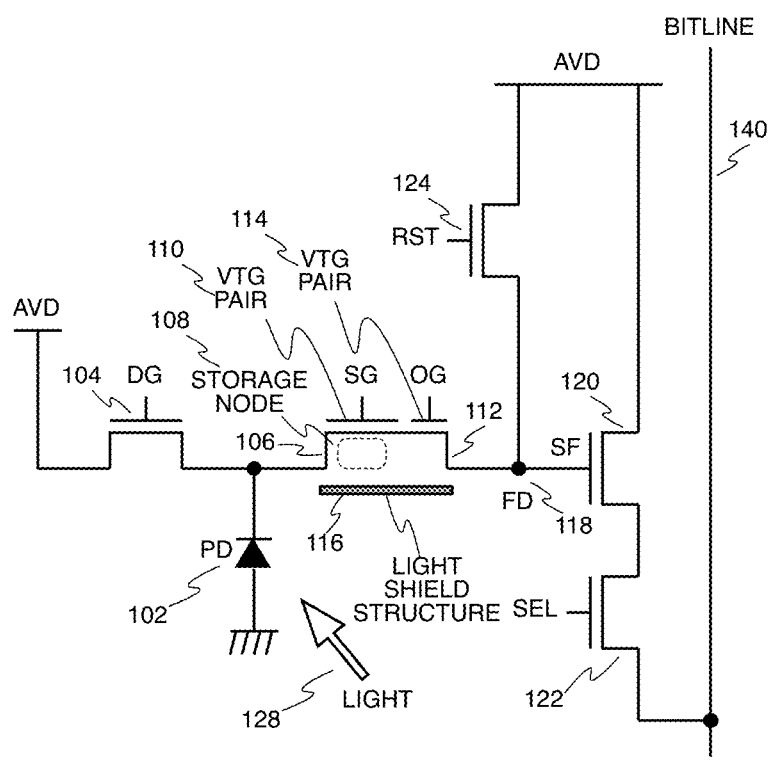
FIG. 1 is a schematic illustrating one example of a pixel cell with a global shutter storage transistor including vertical transfer gate storage structures with in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Apparatuses directed to pixel cells with global shutter storage transistors including vertical transfer gate storage structures arranged in a pixel arrays are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, pixel cells with global shutter storage transistors including vertical transfer gate storage structures arranged in pixel arrays are disclosed. In the various examples, the full well capacity (FWC) of a pixel cell is increased while the area required to store the image charge is reduced to achieve pixel size minimization and thereby increase the pixel fill factor in the pixel array. In one example, a pixel cell includes a storage gate with a vertical transfer gate (VTG) structure that has a planar gate electrode and two vertical trench structures that extend into the semiconductor material layer, such as a silicon substrate. A storage node is formed in the semiconductor material layer area between the two vertical trench structures below the surface of the semiconductor material layer to store the image charge from the photodiode. By adjusting the doping concentration at the surface region of the semiconductor material layer underneath the storage gate electrode, the separation between the trenches of the VTG structure, and the depth of the trenches of the VTG structure, the charge storage capacity of the storage node can be configured.

During operation, the storage gate of the storage transistor is biased to transfer the image charges photogenerated in the photodiode region to the storage node. An output gate with VTG structures is also disclosed to transfer the charge from the storage node to a floating diffusion region of the pixel cell for readout. In operation, the image charge stored in the storage node is transferred to the floating diffusion region by biasing the output gate.

In various examples, a light shielding structure with deep trench isolation (DTI) structures filled with light blocking material (e.g., metal such as tungsten, aluminum, etc.) may be formed on the backside of the semiconductor material layer to help prevent incident light from entering the storage node through the backside of the semiconductor material layer.

In various examples, a pixel cell layout of pixel cells in a pixel array is disclosed in which where all transistor devices (e.g., storage transistor, output transistor, anti-blooming transistor, reset transistor, source follow, row select transistor, etc.) included in the pixel circuitry of the pixel cell are formed in a centralized location in the semiconductor material layer surrounded only by the photodiode regions of neighboring pixels. In the arrangement, the alignment of the photodiode region and the pixel circuitry of each one of the pixel cells is arranged at a 45 degree angle relative to the vertical/horizontal arrangement of the plurality of rows and the plurality of columns of the pixel array. As such, layout space further saved, which allows the area of the photodiode region to be increased. At the same time, photodiode regions of the pixel cells may still be organized into vertical rows and horizontal columns for image capturing in accordance with the teachings of the present invention.

To illustrate, FIG. 1 is a schematic illustrating one example of a pixel cell 138 with a global shutter storage transistor including vertical transfer gate storage structures with in accordance with the teachings of the present invention. As shown in the depicted example, the pixel cell 138 includes a photodiode 102, which is disposed in a semiconductor material layer (e.g., silicon substrate) and accumulates image charge in response to incident light 128. In one example, the incident light 128 is directed through a backside of the semiconductor material layer to the photodiode 102. An anti-blooming transistor 104 is coupled between a voltage supply AVD and the photodiode 102. In one example, the anti-blooming transistor 104 is configured to be turned on in response to an anti-blooming signal DG to drain out excess charges from the photodiode 102 to avoid blooming.

In the depicted example, a storage transistor 106 is coupled to the photodiode 102 to store the image charge photogenerated in the photodiode 102. In one example, the storage transistor 106 includes a storage gate that includes a pair of vertical transfer gate (VTG) portions 110 that extend into the semiconductor material layer. The storage transistor includes a storage node 108 is disposed in the semiconductor material layer below the storage gate of storage transistor 106 and between the pair of VTG portions 110 of the storage gate to store the image charge transferred from the photodiode 102 in response to a storage signal SG, which is coupled to bias the storage transistor 106 in accordance with the teachings of the present invention.

In one example, an output transistor 112 is coupled between the storage transistor 106 and a floating diffusion FD 118 disposed in the semiconductor material layer. The output transistor 112 is coupled to transfer the image charge stored in the storage node 106 to the floating diffusion FD 118 in response to an output signal OG. In one example, the output transistor 112 includes an output gate that also includes a pair of vertical transfer gate (VTG) portions 114 that that extend into the semiconductor material layer.

In one example, a light shield structure 116 is formed on an opposite surface of the semiconductor material layer to shield the incident light 128 from entering the storage node 106 through the backside of the semiconductor material layer. For instance, in one example, the transistors of pixel cell 138 (e.g., including the storage transistor 106 and the output transistor 112) of pixel cell formed on or proximate to the front side of the semiconductor material layer, and the light shield structure 116 is formed on or proximate to the backside of the semiconductor material layer. In the example, the light shield structure 116 includes a pair of deep trench isolation (DTI) portions that are filled with a light blocking material such as metal (e.g., aluminum, tungsten, etc.). Each one of the pair of DTI portions of the light shield structure 116 extends into the semiconductor material layer through the backside towards the front side of the semiconductor material layer.

In the depicted example, a reset transistor 124 is coupled between the voltage supply AVD and the floating diffusion FD 118 to reset the pixel cell 138, including resetting the floating diffusion FD 118, in response to a reset signal RST. A source follower transistor 120 is coupled to the floating diffusion FD 118 and the voltage supply AVD as shown to convert the image charge stored in the floating diffusion FD 118 into a pixel output signal. A select transistor 122 is coupled to the source follower transistor 120 to output the pixel output signal from the source follower transistor 120 to an output bitline 140 in response to a select signal SEL.

Figure 2A:
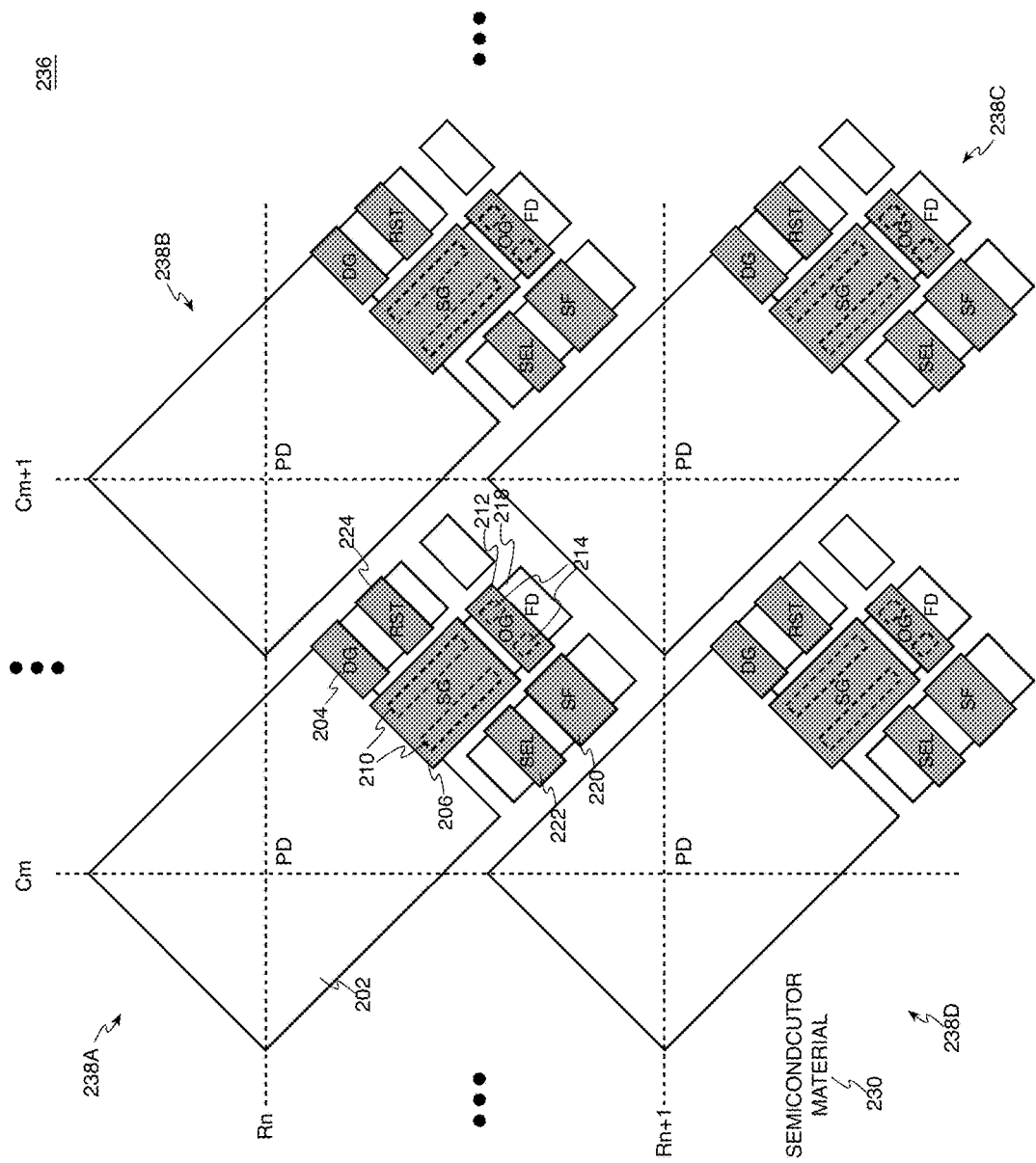
FIG. 2A is a plan view of one example pixel cells with global shutter storage transistors including vertical transfer gate storage structures arranged in a pixel array in a semiconductor material layer in accordance with the teachings of the present invention.

FIG. 2A is a plan view of one example a plurality of pixel cells with global shutter storage transistors including vertical transfer gate storage structures arranged in a pixel array 236 in a semiconductor material layer 230 in accordance with the teachings of the present invention. In the depicted example, four pixel cells 238A, 238B, 238C, and 238D of the pixel array 236 are shown for explanation purposes. It is appreciated of course that in other examples, pixel array 236 may include more than four pixel cells as illustrated in FIG. 2A. It is noted that pixel cells 238A, 238B, 238C, and 238D of FIG. 2A may be examples of the pixel cell 138 of FIG. 1, and that similarly named and numbered elements referenced below are coupled and function similar to as described above.

As shown in the depicted example, the pixel array 236 is arranged into a plurality of rows and a plurality of columns of pixel cells. In particular, the pixel cell 238A is the pixel located at column Cm and row Rn of the pixel array 236. The pixel cell 238B is the pixel located at neighboring column Cm+1 and row Rn of the pixel array 236. The pixel cell 238C is the pixel located at column Cm+1 and neighboring row Rn+1 of the pixel array 236. The pixel cell 238D is the pixel located at neighboring column Cm and neighboring row Rn+1 of the pixel array 236. In the example, it is noted that pixel cells 238A, 238B, 238C, and 238D are substantially similar to one another. As such, it is appreciated only the pixel cell 238A will be described in detail herein for the sake of brevity and in order to avoid obscuring the teachings of the present invention.

As shown, the pixel cell 238A includes a photodiode 202 disposed in a semiconductor material layer 230 to accumulate image charge that is photogenerated in the photodiode 202 in response to incident light. A storage transistor 206 is coupled to the photodiode 202 to store the image charge photogenerated in the photodiode 202. The storage transistor 206 includes a storage gate disposed proximate a first surface (e.g., a front side surface) of the semiconductor material layer 230. In the example, the storage gate of storage transistor 206 includes a pair of vertical transfer gate (VTG) portions 210. As will be shown below, each one of the pair of VTG portions 210 extends into the semiconductor material layer 230 through the first surface of the semiconductor material layer 230. As will be shown below, a storage node is disposed or formed below the first surface of the semiconductor material layer 230 and between the pair of VTG portions 210 of the storage gate to store the image charge transferred from the photodiode 202 in response to a storage signal SG that is coupled to bias the storage transistor 206.

In one example, during a charge transfer operation, the storage gate of the storage transistor 206 may be biased with the storage signal SG having a positive signal level to transfer the accumulated image charge from the photodiode 202 to the storage node.

An output transistor 212 coupled between the storage transistor 206 and a floating diffusion FD 218 disposed in the semiconductor material layer 230. The output transistor 212 is coupled to transfer the image charge stored in the storage node of the storage transistor 206 to the floating diffusion FD 218 in response to an output signal OG. In the example, the output transistor 212 includes an output gate disposed proximate the surface of the semiconductor material layer 230. The output gate of the output transistor 212 also includes a pair of vertical transfer gate (VTG) portions 214. Each one of the pair of VTG portions 214 extends into the semiconductor material layer 230 through the first surface of the semiconductor material layer 230. As the accumulated image charges are stored in the storage node, which is located at a depth from the first surface of the semiconductor material layer 230, as such the pair of VTG portions 214 of the output transistor 212 can operatively transfer accumulated image charges from the storage node to the floating diffusion FD 218 in response to the output signal OG. In other words, the accumulated image charges in the storage node can be transferred from the storage node to the floating diffusion FD 218 through the pair of VTG portions 214 of the output transistor 212.

The example depicted in FIG. 2A also shows an anti-blooming transistor 204, which is coupled to the photodiode 202, and is configured to be turned on in response to an anti-blooming signal DG to drain out excess charges from the photodiode 202 to avoid blooming. In one example, the anti-blooming transistor 204 may be turned on before and after exposure period or integration period to form a blooming path and drain out the excess charges from the photodiode 202. In the depicted example, a reset transistor 224 is coupled to the floating diffusion FD 218 to reset the pixel cell in response to a reset signal RST. A source follower transistor 220 is coupled to the floating diffusion FD 218 to convert the image charge stored in the floating diffusion FD 218 into a pixel output signal. A select transistor 222 is coupled to the source follower transistor 220 to output the pixel output signal from the source follower transistor 220 in response to a select signal SEL.

In the illustrated example, the transistors of pixel cell 238A may be referred to collectively as being included in the pixel circuitry of pixel cell 238A. For instance, the pixel circuitry of pixel cell 238A includes the anti-blooming transistor 204, the storage transistor 206, the output transistor 212, the reset transistor 224, the select transistor 222, and the source follower transistor 220. As shown in the depicted example, the pixel circuitry of the pixel cell 238 is coupled to the photodiode 202, and disposed in the semiconductor material layer 230 in a central area that is laterally surrounded by the photodiode 202 of the pixel cell 238A (e.g., on the upper left diagonal in FIG. 2A), by the photodiode of pixel cell 238B of the same row Rn and next column Cm+1 (e.g., on the upper right diagonal in FIG. 2A), by the photodiode of pixel cell 238C of the next row Rn+1 and the next column Cm+1 (e.g., on the lower right diagonal in FIG. 2A), and by the photodiode of pixel cell 238D of the next row Rn+1 and the same column Cm (e.g., on the lower left diagonal in FIG. 2A). As a result, the alignment of the photodiode 202 and the pixel circuitry of pixel cell 238A is arranged at a substantially 45 degree angle relative to the horizontal/vertical arrangement of the plurality of rows Rn, Rn+1 and the plurality of columns Cm, Cm+1 of the pixel array 236 in accordance with the teachings of the present invention.

It is noted that in conventional pixel arrays, some transistors are arranged in a vertical direction while some are arranged in a horizontal direction on the device region near the corresponding pixels. However, in the example illustrated in FIG. 2A, the layout of the pixel cells of the pixel array 236 oriented at substantially 45 degree angle relative to the rows and columns. Thus, all of the transistors in the pixel circuitry of each pixel cell 238A, 238B, 238C, and 238D are formed in a centralized area and are surrounded only by the photodiode regions of the neighboring pixels (e.g., 3 pixels), while the pixel cells 238A, 238B, 238C, and 238D are arranged or aligned in the horizontal/vertical rows and columns for of image capturing operations.

Figure 2B:
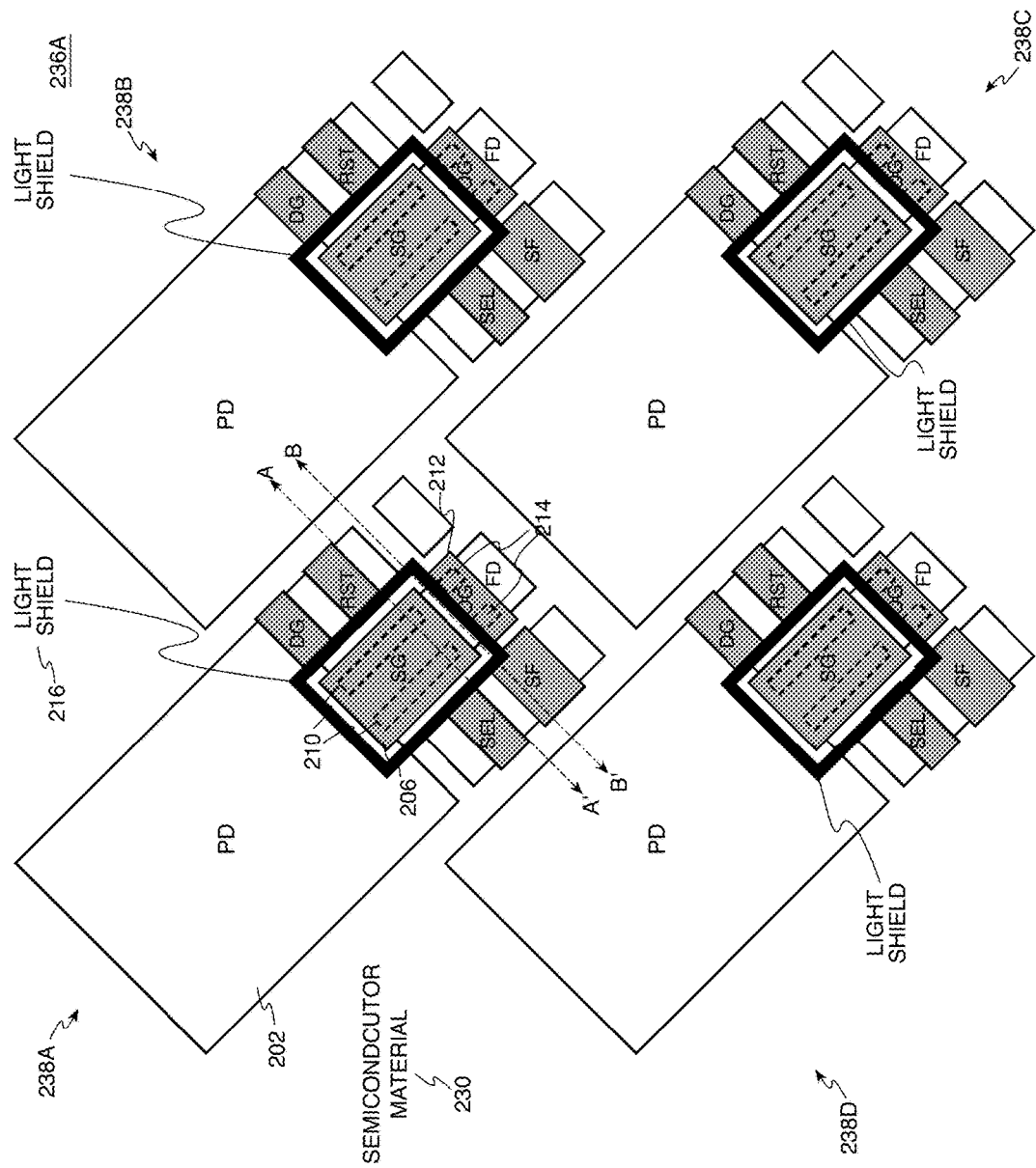
FIG. 2B is a plan view of another example pixel cells with global shutter storage transistors including vertical transfer gate storage structures illustrating light shield structures with backside deep trench isolation structures arranged in a pixel array in a semiconductor material layer in accordance with the teachings of the present invention.

FIG. 2B is another plan view of example pixel cells 238A, 238B, 238C, and 238D, which also shows light shield structures 216 with backside deep trench isolation structures arranged in the pixel array 236A in a semiconductor material layer 230 in accordance with the teachings of the present invention. It is noted that pixel array 236A FIG. 2B may be another example of the pixel array 236 of FIG. 2A, and that similarly named and numbered elements referenced below are coupled and function similar to as described above. Indeed, it is noted that pixel cells 238A, 238B, 238C, and 238D shown in FIG. 2B share many similarities with pixel cells 238A, 238B, 238C, and 238D shown in FIG. 2A.

However, the example shown in FIG. 2B illustrates the placement of light shield structures 216 relative to the storage transistors 206 in pixel cells 238A, 238B, 238C, and 238D. In particular, each light shield structure 216 is disposed proximate to a second surface (e.g., a backside surface that is opposite the front side surface) of the semiconductor material layer 230 to shield the storage node of the storage transistor 206 from being penetrated by the incident light entered through the second surface of the semiconductor material layer 230. As will be discussed, in one example, each light shield structure 216 includes a pair of deep trench isolation (DTI) portions that extend into the semiconductor material layer 230 through the second surface (e.g., backside surface) towards the first surface (e.g., front side surface) of the semiconductor material layer 230.

Figure 3B:
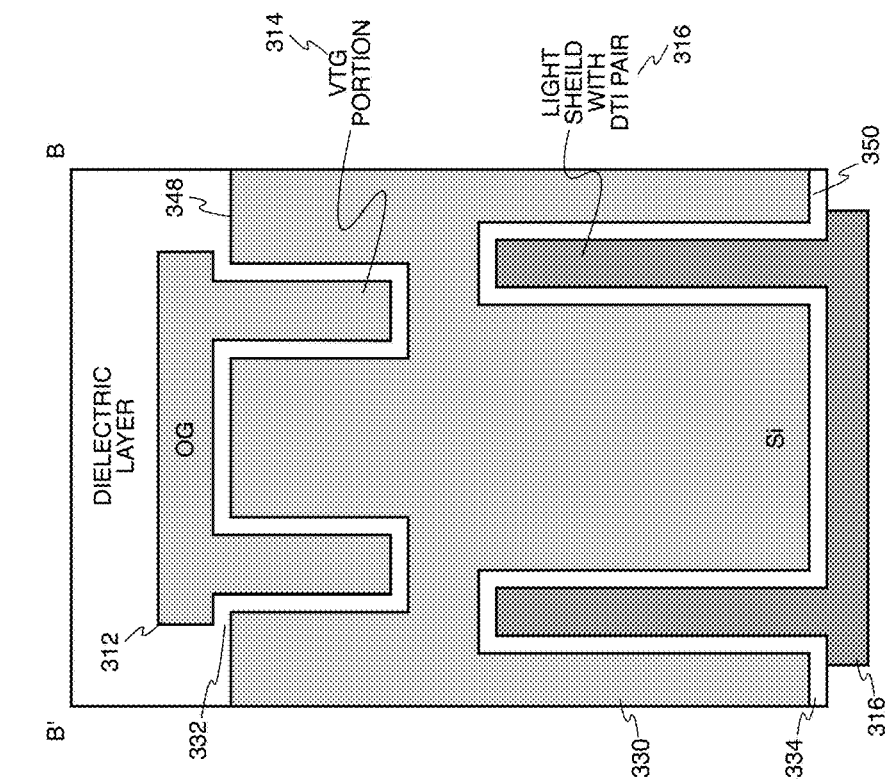
FIG. 3B is a cross-section view illustrating a portion of one example of a pixel cell with an output transistor including vertical transfer gates and a backside light shield structure including a deep trench isolation pair in accordance with the teachings of the present invention.
Figure 3A:
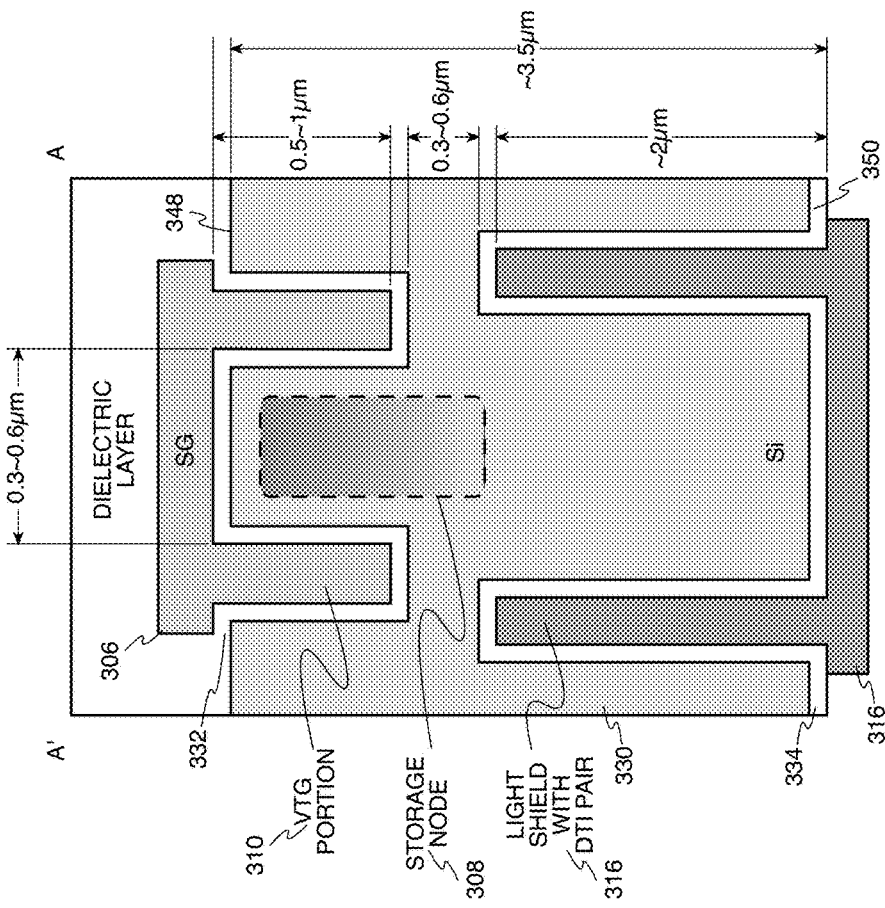
FIG. 3A is a cross-section view illustrating a portion of one example of a pixel cell with a global shutter storage transistor including vertical transfer gate storage structures and a backside light shield structure including a deep trench isolation pair in accordance with the teachings of the present invention.

To illustrate, FIG. 3A is a cross-section view illustrating a portion of one example of a pixel cell with a global shutter storage transistor including vertical transfer gate storage structures and a backside light shield structure including a deep trench isolation pair in accordance with the teachings of the present invention. It is noted that the global shutter storage transistor of FIG. 3A may be an example of the storage transistor 206 of FIGS. 2A-2B and/or of the storage transistor 106 of FIG. 1, and that similarly named and numbered elements referenced below are coupled and function similar to as described above. It is appreciated that the cross-section view shown in FIG. 3A is an example of a cross-section through the gate of storage transistor 206 and the light shield structure 216 along dashed line A'-A of FIG. 2B.

As shown in the example depicted in FIG. 3A, a storage transistor 306 includes a storage gate disposed proximate a first surface (e.g., front side surface) 348 of a semiconductor material layer 330. In one example, the storage gate of the storage transistor 306 is formed with polysilicon, and the semiconductor material layer 330 is formed with a silicon substrate. In one example, the semiconductor material layer 330 may have thickness ranging from 3 μm to 6 μm. In one example, the semiconductor material layer 330 has a thickness of approximately ~3.5 μm between the first surface (e.g., front side surface) 348 and a second surface (e.g., backside surface) 350 of the semiconductor material layer 330. In the example, the storage gate of the storage transistor 306 includes a pair of vertical transfer gate (VTG) portions 310. In the example, each one of the pair of VTG portions 310 is also formed from polysilicon, and extends a first distance into the semiconductor material layer 330 through the first surface 348 of the semiconductor material layer 330 toward the second surface 350. For instance, as shown in the depicted example, the VTG portions 310 may extend approximately 0.5 μm~1 μm into the semiconductor material layer 330. In the example, there is a thin insulating layer 332, such as for example a thin silicon dioxide (SiO$_2$) layer, between the semiconductor material layer 330 and the planar gate and VTG portions 310 of the storage gate of the storage transistor 306. In the example, there is a dielectric layer or an insulating layer, such as oxide, formed on the storage gate of the storage transistor 306 and the thin insulating layer 332 covering the storage gate of the storage transistor 306.

In one example, the thin insulating layer 332 may be formed prior to the formation of the VTG portions 310. The VTG portions 310 may be formed by patterning and etching a pair of trench structures. Subsequently depositing the thin insulating layer 332, by a deposition technique such as Chemical vapor deposition (CVD), into the pair of trench structures covering the sidewalls and bottoms of the pair of trench structures interfacing with the semiconductor material layer 330 and the first surface (e.g., front side surface) 348 of the semiconductor material layer 330. Then, depositing conductive material such as polysilicon into the pair of trench structures to form the VTG portions 310. The dielectric layer or the insulating layer may be formed on the storage gate of the storage transistor 306 and the thin insulating layer 332 after the formation of the storage gate of the storage transistor 306 by CVD.

As shown in the depicted example, a storage node 308 is disposed below the first surface 348 of the semiconductor material layer 330 and between the pair of VTG portions 310 of the storage gate to store the image charge transferred from the photodiode (not shown in FIG. 3A) in response to a storage signal SG. In one example, the storage node 308 is formed with an N-type gradient implant of dopants in the semiconductor material layer 330. In the example, the gradient doping concentration of the storage node 308 decreases from a portion of the storage node 308 that is closest to the first surface (e.g., front side surface) 348 of the semiconductor material layer 330 to a portion of the storage node 308 closest to the second surface (e.g., backside surface) 350 of the semiconductor material layer 350 opposite the first surface (e.g., front side surface) 348 of the semiconductor material layer 330. In one example, doping concentration of the portion of the storage node 308 that is closest to the first surface (e.g., front side surface) 348 of the semiconductor material layer 330 may be $8 \times 10^{16}$ per cm$^3$, and gradually decreases to a doping concentration of $1 \times 10^{16}$ per cm$^3$ toward the portion of the storage node 308 that is closest to the second surface (e.g., backside surface) 350 of the semiconductor material layer 350. In addition, it is appreciated that the portion of the storage node 308 that is closest to the first surface 348 of the semiconductor material layer 330 is below the first surface 348 of the semiconductor material layer 330 by a depth greater than zero. In other words, there is a gap of the semiconductor material layer 330 between the first surface 348 and the portion of the storage node 308 that is closest to the first surface 348 in the depicted example. In one example, the storage node 308 formed between the pair of VTG portions 310 can be embedded in the semiconductor material layer 330, and located at a depth from the first surface 348 of the semiconductor material layer 330 preventing the storage node 308 from interfacing with the oxide-silicon interface, e.g., the interface between the first surface (e.g., front side surface) 348 of the semiconductor material layer 330 and the thin insulating layer 332. It is also appreciated that the first distance that the VTG portions 310 extended into the semiconductor material layer 330 and the N-type gradient implant profile for the storage node 308 may be configured based on the desired storage capacity of the storage node 308 for the pixel cell.

The example illustrated in FIG. 3A also illustrates a light shield structure 316 proximate to the second surface (e.g., backside surface) 350 of the semiconductor material layer 330 to shield the storage node 308 from incident light that is directed through the second surface (e.g., backside surface) 350 of the semiconductor material layer 330 to the photodiode (not shown in FIG. 3A). Alternatively, the light shield structure 316 functions to prevent the incident light from entering the storage node 308 through the second surface (e.g., backside surface) 350 interfering with the image charge store in the storage node 308. As shown in the example, light shield structure 316 includes a planar portion on the second surface (e.g., backside surface) 350 of the semiconductor material layer 330, as well as a pair of deep trench isolation (DTI) portions that extend a second distance into the semiconductor material layer 330 through the second surface (e.g., backside surface) 350 towards the first surface (e.g., front side surface) 348 of the semiconductor material layer 330. For instance, as shown in the depicted example, the DTI portions of the light shield structure 316 extend approximately 2 μm into the semiconductor material layer 330. In the example, there is a thin insulating layer 334, such as for example a thin silicon dioxide ($SiO_2$) layer, between the semiconductor material layer 330 and planar and between the semiconductor material layer 330 and the DTI portions of the light shield structure 316 at the second surface (e.g., backside surface) 350. In the example, the planar portion as well as the DTI portions of the light shield structure 316 are filled with a light blocking material. In various examples, the light blocking material may be a metal, such as aluminum, tungsten, or other suitable light blocking material.

As such, it is noted that in example depicted in FIG. 3A, the sum of the distance that the VTG portions 310 of storage transistor 306 extend into the semiconductor material layer 330 from the first surface (e.g., front side surface) 348 (e.g., 0.5~1 μm), and the distance that the DTI portions of light shield structure 316 extend into the semiconductor material layer 330 from the back side 350 (e.g., ~2 μm) is less than the thickness of the semiconductor material layer 330 (e.g., ~3.5 μm). For instance, in one example, there is a gap of approximately 0.30.6 μm of the semiconductor material layer 330 between the distal ends of the VTG portions 310 of the storage transistor 306 and the distal ends of the DTI portions of light shield structure 316 since the of the semiconductor material layer 330 is greater than the sum of the lengths of the VTG portions 310 of the storage transistor 306 and the DTI portions of light shield structure 316.

FIG. 3B is a cross-section view illustrating a portion of an example of a pixel cell with an output transistor including vertical transfer gate storage structures and a backside light shield structure including a deep trench isolation pair in accordance with the teachings of the present invention. It is noted that output transistor of FIG. 3B may be an example of output transistor 212 of FIGS. 2A-2B and/or of the output transistor 112 of FIG. 1, and that similarly named and numbered elements referenced below are coupled and function similar to as described above. It is appreciated that the cross-section view shown in FIG. 3B is an example of a cross-section through the gate of the output transistor 212 and light shield structure 216 along dashed line B'-B of FIG. 2B.

As shown in the example depicted in FIG. 3B, an output transistor 312 includes an output gate disposed proximate the first surface (e.g., front side surface) 348 of the semiconductor material layer 330. In one example, the output gate of the output transistor 312 is formed with polysilicon. In the example, the output gate of the output transistor 312 includes a pair of vertical transfer gate (VTG) portions 314. In the example, each one of the pair of VTG portions 314 is also formed from polysilicon, and extends a first distance into the semiconductor material layer 330 through the first surface 348 of the semiconductor material layer 330. For instance, as shown in the depicted example, the VTG portions 314 extend the same distance as the VTG portions 310 of the storage transistor 306 of approximately 0.5~1 μm into the semiconductor material layer 330. In the example, there is a thin insulating layer 332, such as for example a thin silicon dioxide ($SiO_2$) layer, between the semiconductor material layer 330 and the planar gate and VTG portions 314 of the output gate of output transistor 312. In the example, there is a dielectric layer or an insulating layer, such as oxide, formed on the output gate of the output transistor 312 and the thin insulating layer 332 covering the output gate of the output transistor 312.

In one example, the thin insulating layer 332 may be formed prior to the formation of the VTG portions 314. The VTG portions 314 may be formed by patterning and etching a pair of trench structures. Subsequently depositing the thin insulating layer 332, by a deposition technique such as Chemical vapor deposition (CVD), into the pair of trench structures covering the sidewalls and the bottoms of the pair of trench structures interfacing with the semiconductor material layer 330 and the first surface (e.g., front side surface) 348 of the semiconductor material layer 330. Then, depositing conductive material such as polysilicon into the pair of trench structures to form the VTG portions 314. The dielectric layer or the insulating layer may be formed on the output gate of the output transistor 312 and the thin insulating layer 332 after the formation of the output gate of the output transistor 312 by CVD.

The example illustrated in FIG. 3B also illustrates the light shield structure 316 proximate to the second surface (e.g., backside surface) 350 of the semiconductor material layer 330 to shield the charge transfer region below the output gate of the output transistor 312 as well as the storage node 308 from the incident light that is directed through the second surface (e.g., backside surface) 350 of the semiconductor material layer 330 to the photodiode (not shown in FIG. 3B). As discussed above, the light shield structure 316 includes the planar portion on the second surface (e.g., backside surface) 350 of the semiconductor material layer 330, as well as the pair of deep trench isolation (DTI) portions that extend the second distance into the semiconductor material layer 330 through the second surface (e.g., backside surface) 350 towards the first surface (e.g., front side surface) 348 of the semiconductor material layer 330. In the depicted example, the DTI portions of the light shield structure 316 extend approximately 2 μm into the semiconductor material layer 330. In the example, there is a thin insulating layer 334, such as for example a thin silicon dioxide ($SiO_2$) layer, between the semiconductor material layer 330 and planar and DTI portions of the light shield structure 316 at the backside surface 350.

As such, it is noted that in example depicted in FIG. 3B, the sum of the distance that the VTG portions 314 of the output transistor 312 extend into the semiconductor material layer 330 from the first surface (e.g., front side surface) 348, and the distance that the DTI portions of the light shield structure 316 extend into the semiconductor material layer 330 from the back side 350 is less than the thickness (e.g., ~3.5 μm) of the semiconductor material layer 330. For instance, in one example, there is the same gap of approximately 0.3~0.6 μm of semiconductor material layer 330 between the distal ends of the VTG portions 314 of the output transistor 312 and the distal ends of the DTI portions of the light shield structure 316 since the thickness of the semiconductor material layer 330 is greater than the sum of the lengths of the VTG portions 314 of the output transistor 312 and the DTI portions of the light shield structure 316. In one example, the distance that the VTG portions 314 of the output transistor 312 extend into the semiconductor material layer 330 may be different from the distance the VTG portions 310 of the storage transistor 306 of FIG. 3A extend into the semiconductor material layer 330.

Figure 3C:
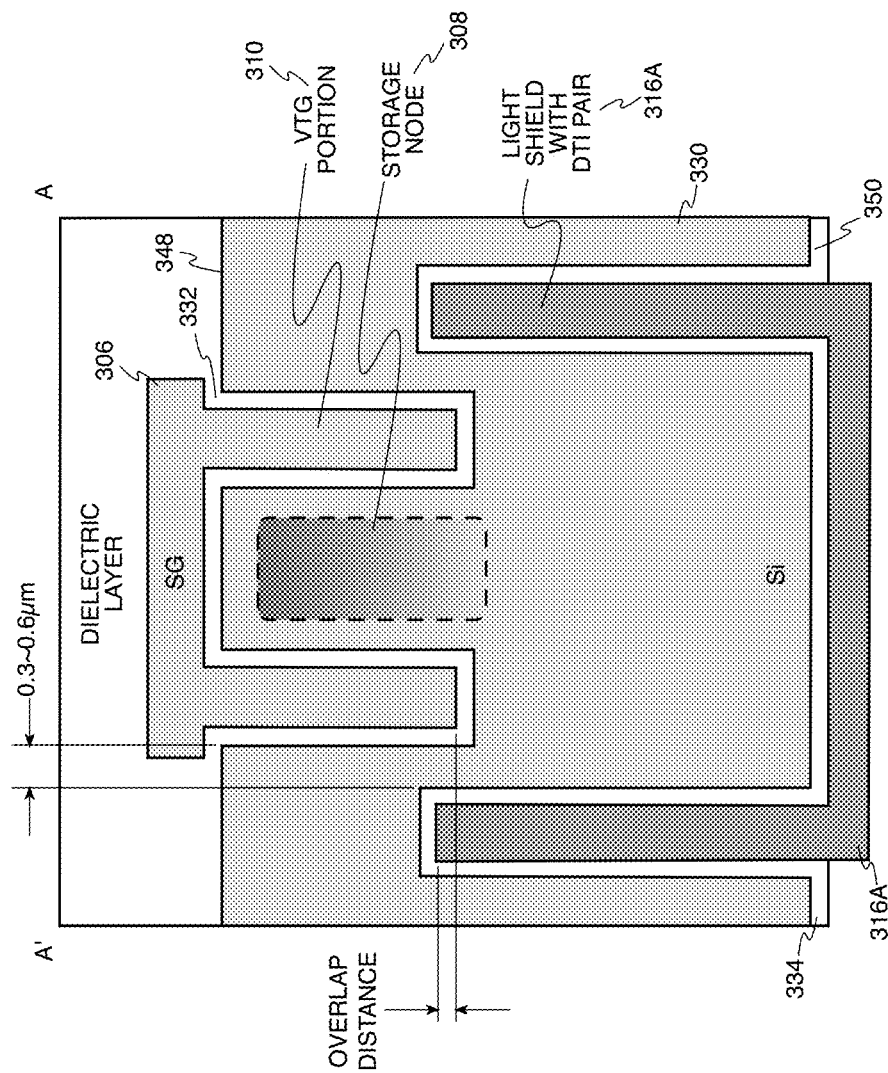
FIG. 3C is a cross-section view illustrating a portion of another example of a pixel cell with a global shutter storage transistor including vertical transfer gate storage structures and a backside light shield structure including a deep trench isolation pair in accordance with the teachings of the present invention.

FIG. 3C is a cross-section view illustrating a portion of another example of a pixel cell with a global shutter storage transistor including vertical transfer gate storage structures and a backside light shield structure including a deep trench isolation pair in accordance with the teachings of the present invention. It is noted that storage transistor 306 of FIG. 3C is another example of the storage transistor 306 of FIG. 3A, and/or the storage transistor 206 of FIGS. 2A-2B, and/or of the storage transistor 106 of FIG. 1, and that similarly named and numbered elements referenced below are coupled and function similar to as described above. It is appreciated that the cross-section view shown in FIG. 3C is another example of a cross-section through the gate of the storage transistor 206 and the light shield structure 216 along dashed line A'-A of FIG. 2B. It is further appreciated that the cross-section view shown in FIG. 3C shares many similarities with the example shown in FIG. 3A.

For instance, as shown in the example depicted in FIG. 3C, a storage transistor 306 includes a storage gate disposed proximate the first surface (e.g., front side surface) 348 of a semiconductor material layer 330. In one example, the storage gate of the storage transistor 306 is formed with polysilicon, and the semiconductor material layer 330 is formed with a silicon substrate. In the example, the storage gate of the storage transistor 306 includes a pair of vertical transfer gate (VTG) portions 310. In the example, each one of the pair of VTG portions 310 is also formed from polysilicon, and extends a first distance into the semiconductor material layer 330 through the first surface (e.g., the front side surface) 348 of the semiconductor material layer 330. In the example, there is a thin insulating layer 332, such as for example a thin silicon dioxide ($SiO_2$) layer, between the semiconductor material layer 330 and the planar gate and VTG portions 310 of the storage gate of the storage transistor 306.

As shown in the depicted example, the storage node 308 is disposed below the first surface 348 of the semiconductor material layer 330 and between the pair of VTG portions 310 of the storage gate to store the image charge transferred from the photodiode in response to a storage signal SG. In one example, the storage node 308 is formed with an N-type gradient implant of dopants in the semiconductor material layer 330. In the example, the gradient doping concentration of the storage node 308 decreases from a portion of the storage node 308 that is closest to the first surface (e.g., front side) 348 of the semiconductor material layer 330 to a portion of the storage node 308 closest to the second surface (e.g., backside surface) 350 of the semiconductor material layer 350 opposite the first surface 348 of the semiconductor material layer 350. In addition, it is appreciated that the portion of the storage node 308 that is closest to the first surface 348 of the semiconductor material layer 330 is below the first surface 348 of the semiconductor material layer 330 by a depth greater than zero. In other words, there is a gap of the semiconductor material layer 330 between the first surface 348 and the portion of the storage node 308 that is closest to the first surface 348 in the depicted example.

The example illustrated in FIG. 3C also illustrates a light shield structure 316A proximate to the second surface (e.g., backside surface) 350 of the semiconductor material layer 330 to shield the storage node 308 from incident light that is directed through the second surface (e.g., backside surface) 350 of the semiconductor material layer 330 to the photodiode. As shown in the example, the light shield structure 316A includes a planar portion on the second surface (e.g., backside surface) 350 of the semiconductor material layer 330, as well as a pair of deep trench isolation (DTI) portions that extend a second distance into the semiconductor material layer 330 through the second surface (e.g., backside surface) 350 towards the first surface (e.g., front side surface) 348 of the semiconductor material layer 330. In the example, there is a thin insulating layer 334, such as for example a thin silicon dioxide ($SiO_2$) layer, between the semiconductor material layer 330 and planar and DTI portions of light shield structure 316A at the second surface (e.g., backside surface) 350 of the semiconductor material layer 330. In the example, the planar portion as well as the DTI portions of light shield structure 316A are filled with a light blocking material. In various examples, the light blocking material may be a metal, such as aluminum, tungsten, or other suitable light blocking material.

As illustrated in example depicted in FIG. 3C, the sum of the distance that the VTG portions 310 of storage transistor 306 extend into the semiconductor material layer 330 from the first surface (e.g., front side surface) 348, and the distance that the DTI portions of light shield structure 316A extend into the semiconductor material layer 330 from the second surface (e.g., backside surface) 350 is greater than the thickness of the semiconductor material layer 330. For instance, in one example, there is an overlap distance of greater than zero in the semiconductor material layer 330 between the distal ends of the VTG portions 310 of storage transistor 306 and the distal ends of the DTI portions of the light shield structure 316A since the thickness of the semiconductor material layer 330 is less than the sum of the lengths of the VTG portions 310 of storage transistor 306 and the DTI portions of the light shield structure 316A. As a result, there is a complete absence of any direct "line of sight" path for any light to reach the storage node 308 through the semiconductor material layer 330 without being obstructed by either the planar and VTG portions 310 of the storage transistor 306 and by the planar and DTI portions of the light shield structure 316A. In the illustrated example, it is also appreciated that the VTG portions 310 of the storage transistor 306 and the planar and DTI portions of light shield structure 316A are not in contact with one another. For instance, as shown in the illustrated example, there is a lateral gap distance of approximately 0.30.6 μm of semiconductor material layer 330 between the VTG portions 310 of storage transistor 306 and the planar and DTI portions of light shield structure 316A wherein the distal ends of the VTG portions 310 of storage transistor 306 and the distal ends of the DTI portions of light shield structure 316A overlap. In the depicted example, the distance between the VTG portions 310 of storage transistor 306 is less than the distance between the DTI portions of the light shield structure 316A. As such the distal ends of the VTG portions 310 of the storage transistor 306 are laterally between the distal ends of the DTI portions of the light shield structure 316A in the semiconductor material layer 330 in the overlapping portion.

Figure 4:
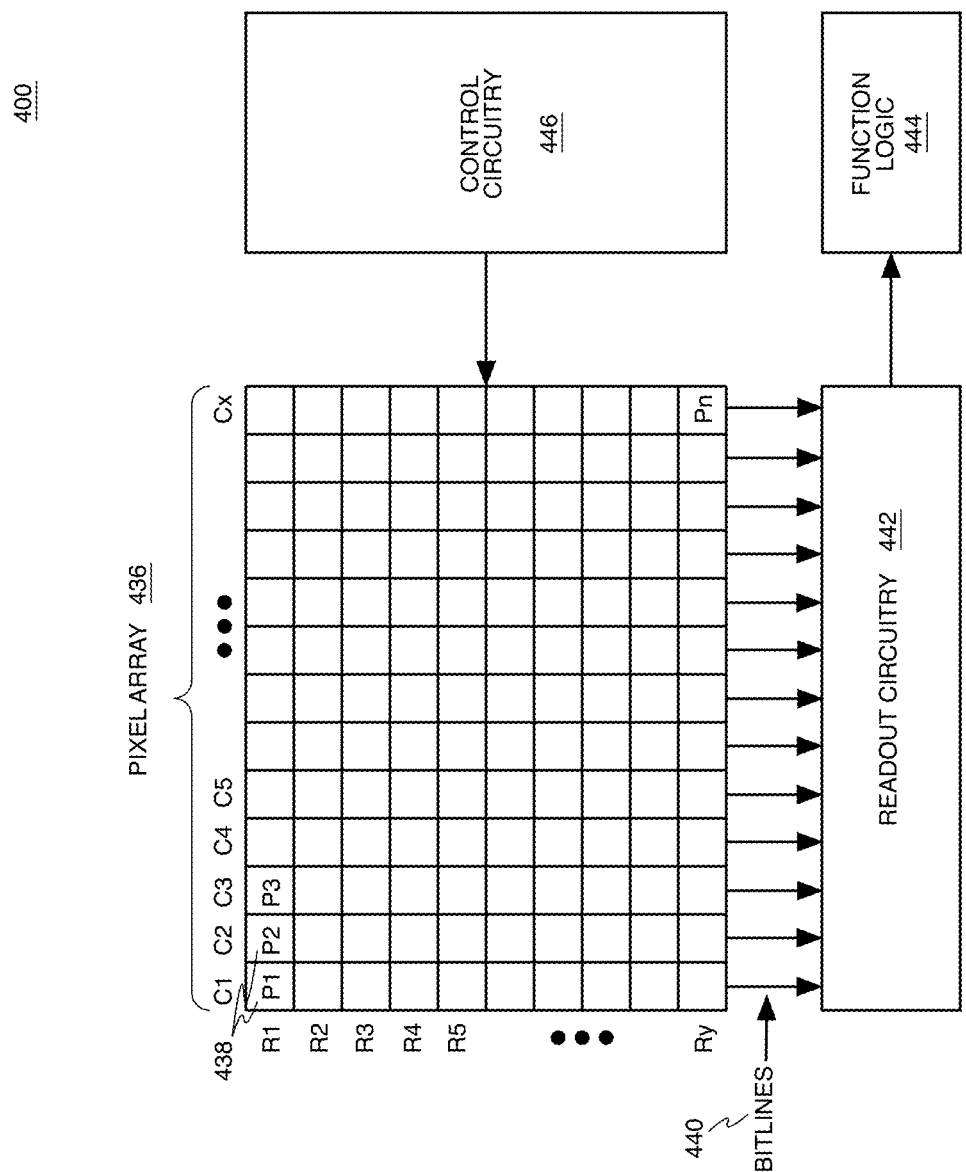
FIG. 4 is a diagram illustrating one example of an imaging system including a pixel array having pixel cells with global shutter storage transistors including vertical transfer gate storage structures in accordance with the teachings of the present invention.

FIG. 4 is a diagram illustrating one example of an imaging system including a pixel array having a plurality of image sensor pixel cells with global shutter storage transistors including vertical transfer gate storage structures in accordance with the teachings of the present invention. As shown in the depicted example, an imaging system 400 includes a pixel array 436 coupled to a control circuitry 446 and a readout circuitry 442, which is coupled to a function logic 444.

In one example, the pixel array 436 is a two-dimensional (2D) array of image sensor pixel cells 438 (e.g., pixels P1, P2, P3, ..., Pn). It is noted that the pixel cells 438 in the pixel array 436 may be examples of the pixel cell 138 of FIG. 1, pixel cells 238A, 238B, 238C, and 238D of FIGS. 2A-2B, and/or pixel cells including the storage transistors 306 and/or overlap transistor 312 of FIGS. 3A-3C, and that similarly named and numbered elements referenced below are coupled and function similar to as described above. As illustrated, each pixel cell 438 is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell 438 has acquired its image data or image charge, the image data is readout by the readout circuitry 443 through bitlines 440 and then transferred to the function logic 444. In various examples, readout circuitry 442 may include amplification circuitry, analog-to-digital (ADC) conversion circuitry, or otherwise. Function logic 444 may include logic and memory for storing the image data or even manipulating the image data by applying post image effects (e.g., crop, rotate, remove red eye, adjust brightness, adjust contrast, or otherwise). In one example, the readout circuitry 442 may readout a row of image data at a time along readout column lines (illustrated) or may readout the image data using a variety of other techniques (not illustrated), such as a serial readout or a full parallel readout of all pixels simultaneously.

In one example, the control circuitry 446 is coupled to the pixel array 436 and may include logic and memory for controlling operational characteristics of the pixel array 436. In one example, the control circuitry 446 is coupled to generate global shutter and control signals discussed above for controlling image acquisition for each pixel cell 438. In one example, the global shutter and control signals simultaneously enable all pixel cells 438 within pixel array 436 to globally transfer the image charge from each photodiode to respective global shutter storage transistors including vertical transfer gate storage structures during a single acquisition window in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
a photodiode disposed in a semiconductor material layer to accumulate image charge photogenerated in the photodiode in response to incident light; and
a storage transistor coupled to the photodiode to store the image charge photogenerated in the photodiode, wherein the storage transistor comprises:
a storage gate disposed proximate a first surface of the semiconductor material layer, wherein the storage gate includes a pair of vertical transfer gate (VTG) portions, wherein each one of the pair of VTG portions of the storage gate extends a first distance into the semiconductor material layer through the first surface of the semiconductor material layer; and
a storage node disposed below the first surface of the semiconductor material layer and between the pair of VTG portions of the storage gate to store the image charge transferred from the photodiode in response to a storage signal.

2. The pixel cell of claim 1, further comprising an output transistor coupled between the storage transistor and a floating diffusion disposed in the semiconductor material layer, wherein the output transistor is coupled to transfer the image charge stored in the storage node to the floating diffusion in response to an output signal, wherein the output transistor comprises an output gate disposed proximate the first surface of the semiconductor material layer, wherein the output gate includes a pair of vertical transfer gate (VTG) portions, wherein each one of the pair of VTG portions of the output gate extends the first distance into the semiconductor material layer through the first surface of the semiconductor material layer.

3. The pixel cell of claim 2, further comprising a light shield structure proximate to a second surface of the semiconductor material layer to shield the storage node from the incident light, wherein the second surface of the semiconductor material layer is opposite the first surface of the semiconductor material layer.

4. The pixel cell of claim 3, wherein the light shield structure comprises a pair of deep trench isolation (DTI) portions, wherein each one of the pair of DTI portions extends a second distance into the semiconductor material layer through the second surface towards the first surface of the semiconductor material layer.

5. The pixel cell of claim 4, wherein the light shield structure is comprised of a light blocking material, wherein each one of the pair of DTI portions is filled with the light blocking material.

6. The pixel cell of claim 5, wherein the light blocking material comprises aluminum (Al).

7. The pixel cell of claim 4, wherein the first surface of the semiconductor material layer is a front side surface, and wherein the second surface of the semiconductor material layer is a backside surface.

8. The pixel cell of claim 4, wherein the semiconductor material layer has a thickness, wherein a sum of the first distance and the second distance is less than the thickness of the semiconductor material layer.

9. The pixel cell of claim 4, wherein the semiconductor material layer has a thickness, wherein a sum of the first distance and the second distance is greater than the thickness of the semiconductor material layer.

10. The pixel cell of claim 3, wherein the incident light is directed through the second surface of the semiconductor material layer into the photodiode.

11. The pixel cell of claim 1, wherein the semiconductor material layer comprises silicon (Si).

12. The pixel cell of claim 1, wherein the storage node comprises an N-type gradient implant of dopants in the semiconductor material layer.

13. The pixel cell of claim 12, wherein a doping concentration of the storage node decreases from a portion of the storage node closest to the first surface of the semiconductor material layer to a portion of the storage node closest to a second surface of the semiconductor material layer opposite the first surface of the semiconductor material layer.

14. The pixel cell of claim 13, wherein the portion of the storage node closest to the first surface of the semiconductor material layer is below the first surface of the semiconductor material layer by a depth greater than zero.

15. The pixel cell of claim 1, wherein the storage gate comprises polysilicon.

16. An imaging system, comprising:
a pixel array of pixel cells, wherein each one of the pixel cells includes: a photodiode disposed in a semiconductor material layer to accumulate image charge photogenerated in the photodiode in response to incident light; and
a storage transistor coupled to the photodiode to store the image charge photogenerated in the photodiode, wherein the storage transistor comprises:
a storage gate disposed proximate a first surface of the semiconductor material layer, wherein the storage gate includes a pair of vertical transfer gate (VTG) portions, wherein each one of the pair of VTG portions of the storage gate extends a first distance into the semiconductor material layer through the first surface of the semiconductor material layer; and
a storage node disposed below the first surface of the semiconductor material layer and between the pair of VTG portions of the storage gate to store the image charge transferred from the photodiode in response to a storage signal;
a control circuitry coupled to the pixel array to control operation of the pixel array; and
a readout circuitry coupled to the control pixel array to read out image data from the plurality of pixel cells.

17. The imaging system of claim 16, further comprising function logic coupled to the readout circuitry to store the image data from each one of the plurality of pixel cells.

18. The imaging system of claim 16, wherein each one of the plurality of pixel cells further comprises an output transistor coupled between the storage transistor and a floating diffusion disposed in the semiconductor material layer, wherein the output transistor is coupled to transfer the image charge stored in the storage node to the floating diffusion in response to an output signal, wherein the output transistor comprises an output gate disposed proximate the first surface of the semiconductor material layer, wherein the output gate includes a pair of vertical transfer gate (VTG) portions, wherein each one of the pair of VTG portions of the output gate extends the first distance into the semiconductor material layer through the first surface of the semiconductor material layer.

19. The imaging system of claim 18, wherein each one of the plurality of pixel cells further comprises a light shield structure proximate to a second surface of the semiconductor material layer to shield the storage node from the incident light, wherein the second surface of the semiconductor material layer is opposite the first surface of the semiconductor material layer.

20. The imaging system of claim 19, wherein the light shield structure comprises a pair of deep trench isolation (DTI) portions, wherein each one of the pair of DTI portions extends a second distance into the semiconductor material layer through the second surface towards the first surface of the semiconductor material layer.

21. The imaging system of claim 20, wherein the light shield structure is comprised of a light blocking material, wherein each one of the pair of DTI portions is filled with the light blocking material.

22. The imaging system of claim 20, wherein the first surface of the semiconductor material layer is a front side surface, and wherein the second surface of the semiconductor material layer is a backside surface.

23. The imaging system of claim 20, wherein the semiconductor material layer has a thickness, wherein a sum of the first distance and the second distance is less than the thickness of the semiconductor material layer.

24. The imaging system of claim 20, wherein the semiconductor material layer has a thickness, wherein a sum of the first distance and the second distance is greater than the thickness of the semiconductor material layer.

25. The imaging system of claim 19, wherein the incident light is directed through the second surface of the semiconductor material layer into the photodiode.

26. The imaging system of claim 18, wherein the storage transistor and the output transistor are included in pixel circuitry of each one of the pixel cells, wherein the pixel circuitry of each one of the pixel cells further comprises:
an antiblooming transistor coupled to the photodiode;
a source follower transistor coupled to the floating diffusion;
a select transistor coupled to the source follower transistor; and
a reset transistor coupled to the floating diffusion.

27. The imaging system of claim 26, wherein the pixel array of pixel cells is arranged into a plurality of rows and a plurality of columns, wherein the pixel circuitry is disposed in the semiconductor material layer in a central area laterally surrounded by only the photodiode of the pixel cell, by a photodiode of a pixel cell of a same row and next column, by a photodiode of a pixel cell of a next row and the next column, and by a photodiode of a pixel cell of a same column and the next row.

28. The imaging system of claim 27, wherein an alignment of the photodiode and the pixel circuitry of each one of the pixel cells is arranged at a 45 degree angle relative to an arrangement of the plurality of rows and the plurality of columns of the pixel array.

29. The imaging system of claim 16, wherein the storage node comprises an N-type gradient implant of dopants in the semiconductor material layer.

30. The imaging system of claim 29, wherein a doping concentration of the storage node decreases from a portion of the storage node closest to the first surface of the semiconductor material layer to a portion of the storage node closest to a second surface of the semiconductor material layer opposite the first surface of the semiconductor material layer.

31. The imaging system of claim 30, wherein the portion of the storage node closest to the first surface of the semiconductor material layer is below the first surface of the semiconductor material layer by a depth greater than zero.

* * * * *